(12) United States Patent
Delano

(10) Patent No.: US 6,515,604 B2
(45) Date of Patent: Feb. 4, 2003

(54) MIXED SIGNAL PROCESSING UNIT WITH IMPROVED DISTORTION AND NOISE CHARACTERISTICS

(75) Inventor: Cary L. Delano, Los Altos, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/836,622

(22) Filed: Apr. 16, 2001

(65) Prior Publication Data

US 2002/0105450 A1 Aug. 8, 2002

Related U.S. Application Data

(60) Provisional application No. 60/198,111, filed on Apr. 17, 2000.

(51) Int. Cl.[7] .............................................. H03M 3/00
(52) U.S. Cl. ........................ 341/143; 341/118; 341/120; 341/163
(58) Field of Search .................................. 341/143, 163, 341/118, 120

(56) References Cited

U.S. PATENT DOCUMENTS

| | | | | |
|---|---|---|---|---|
| 5,055,846 A | * | 10/1991 | Welland ...................... | 341/155 |
| 5,243,345 A | * | 9/1993 | Naus et al. .................. | 341/143 |
| 5,274,375 A | * | 12/1993 | Thompson ................... | 341/143 |
| 5,392,042 A | * | 2/1995 | Pellon ......................... | 333/166 |
| 5,420,892 A | * | 5/1995 | Okamoto ..................... | 375/350 |
| 5,724,037 A | * | 3/1998 | Lee ............................. | 341/143 |
| 5,757,300 A | * | 5/1998 | Koilpillai et al. ............ | 341/143 |
| 5,805,093 A | * | 9/1998 | Heikkila et al. ............. | 341/143 |
| 5,859,603 A | * | 1/1999 | Noguchi et al. ............. | 341/61 |
| 6,064,326 A | * | 5/2000 | Krone et al. ................. | 341/118 |
| 6,307,493 B1 | * | 10/2001 | Nestler ........................ | 341/143 |
| 6,362,763 B1 | * | 3/2002 | Wang .......................... | 327/337 |
| 6,404,369 B1 | * | 6/2002 | Sheen .......................... | 341/143 |

FOREIGN PATENT DOCUMENTS

WO    01/12559    12/2001

OTHER PUBLICATIONS

Su, David K. and Wooley, Bruce A., *A CMOS Oversampling D/A Converter with a Current–Mode Semidigital Reconstruction Filter*, Dec. 1993, IEEE Journal of Solid–State Circuits, vol. 28, No. 12.

* cited by examiner

*Primary Examiner*—Michael Tokar
*Assistant Examiner*—Nguyen Khai
(74) *Attorney, Agent, or Firm*—Beyer Weaver & Thomas LLP

(57) ABSTRACT

A mixed signal processing unit with non-linear feedforward paths to improve total harmonic distortion (THD) and noise characteristics of the processor. Specifically the signal processing unit includes a first integrator stage configured to receive an input signal and configured to generate a first integrated signal in response thereto, a second integrator stage coupled to the first integrator stage and configured to generate a second integrated signal from the first integrated signal, a sampling stage coupled to the second integrator stage and configured to sample the second integrated signal received from the second integrator stage at a sample frequency and to generated a logic signal, and a non-linear feed-forward signal path coupled between the first integrator stage and the sampling stage.

26 Claims, 3 Drawing Sheets

MIXED SIGNAL PROCESSING UNIT WITH IMPROVED DISTORTION AND NOISE CHARACTERISTICS

CROSS REFERENCE TO A RELATED APPLICATION

This application claims benefit of priority under 35 U.S.C. 119(e) of U.S. Provisional Application No. 60/198,111 filed Apr. 17, 2000 and entitled "MIXED SIGNAL PROCESSING UNIT WITH IMPROVED DISTORTION AND NOISE CHARACTERISTICS" which is incorporated by reference in its entirety.

BACKGROUND OF THE INVENTION

1. Field of the Invention

The present invention relates to the field of sigma-delta mixed signal processors, and more specifically, to a mixed signal processing unit with non-linear feed-forward paths between sigma-delta modulator stages to improve total harmonic distortion (THD) and noise characteristics of the processor.

2. Description of Related Art

A basic mixed signal processor using a sigma-delta modulator includes a sigma-delta loop used to drive a pair of output transistors. The sigma-delta loop includes at least one integrator configured to receive an input signal, a quantizer coupled in series with the output of the modulator and a feedback loop including a digital-to analog converter coupled between the output of the quantizer and the input of the integrator. The feedback signal forces the low frequency components of the output signal of the quantizer to track the low frequency components of the input signal at the integrator input. Any difference between the quantized output and the input signal is accumulated in the integrator and is corrected.

The quantizer is essentially a analog- to -digital converter with a sampling frequency fs. The "order" of a sigma-delta modulator depends on the number of integrators provided in the loop. First, second and third order sigma-delta modulators include one, two and three integrators coupled in series in the loop respectively. For is more information, see for example H. Ballan and M. Declercq, 12 V I-A Class-D Amplifier in 5V CMOS Technology, pp. 559–562 (IEEE 1995 Custom Integrated Circuit Conference), the entirety of which is incorporated herein by reference.

An improvement to standard sigma-delta technology is described in commonly assigned U.S. Pat. No. 5,777,512 for METHOD AND APPARATUS FOR OVERSAMPLED, NOISE-SHAPING, MIXEDSIGNAL PROCESSING the entire specification of which is incorporated herein by reference. In that patent an oversampled, noise-shaping modulator is described which employs continuous-time feedback from the output of its output stage rather than the digital (i.e.state) feedback from before the power switching stage. The continuous-time feedback is provided in such a way as to reduce the aliasing effects on the feedback path introduced by the switching stage which might otherwise interfere with the baseband to an unacceptable degree. That is, the modulator of the abovedescribed patent combines the use of continuous-time feedback to compensate for low frequency distortion and to attenuate the aliasing effects of high frequency distortion introduced via the feedback path. The improved sigma-delta processor therefore provides an efficient, low noise alternative to the traditional sigma-delta processor for a wide variety of applications.

All mixed signal processors using sigma-delta modulators are plagued with a problem of noise with certain high-end applications, such as audio amplifiers. One source of noise, called quantization error, in the signal band is caused by the signal sampling performed by the quantizer. With relatively low input signals, the quantized noise is essentially shaped out by the feedback path while the processor maintains a linear transfer function for the input signals. In fact, the larger the order of the processor, the better the noise shaping characteristics. Second and third order modulators are therefore generally more preferable than single order modulators. For a thorough discussion of sigmadelta modulation noise, see Candy and Temes, *Oversampling Delta-Sigma Data Converters*, pp. 1–25 (IEEE Press, 1992), the entirety of which is incorporated herein by reference.

Distortion is another problem associated with mixed signal processors using sigma-delta modulators. For example, in audio applications, power MOS transistors drive relatively low impedances and must therefore have output impedances smaller than one ohm for good overall efficiency.

As a result, the switching characteristics of such transistors are relatively slow, varying from an ideal switching characteristic in an asymmetric way, and thereby generating distortion. Because standard sigma-delta modulators employ digital or state feedback, the asymmetric edges of the power transistor output are not seen by the integrator stages. Consequently, standard sigma-delta modulators are not able to correct for the distortion introduced by the power MOS transistors because of the use of state feedback.

The aforementioned noise and distortion problems are exasperated when the input signal provided to the processor increases. Sigma-delta modulators are non-linear loops and input signal dependant for large inputs. As the input increases, the energy within the loop and the output signal also increases. This can cause several problems including increased energy passing through an integrator that may cause the integrator to clip, which in turn causes even more noise and distortion. Too much noise and distortion within the loop also eventually causes the output of the processor to enter an unstable state. With multi-order processors, this problem is even worse because the higher the order of the modulator, the output of the processor becomes unstable at lower input signals.

A multi-order sigma-delta digital processor with improved total harmonic distortion (THD) and noise characteristics is therefore needed.

SUMMARY OF THE INVENTION

The present invention relates to a mixed signal processing unit with non-linear feed-forward paths between sigma-delta modulator stages to improve total harmonic distortion (THD) and noise characteristics of the processor. Specifically the signal processing unit includes a first integrator stage configured to receive an input signal and configured to generate a first integrated signal in response thereto, a second integrator stage coupled to the first integrator stage and configured to generate a second integrated signal from the first integrated signal, a sampling stage coupled to the second integrator stage configured to sample the second integrated signal received from the second integrator stage at a sample frequency and to generated a logic signal, and a nonlinear feed-forward signal path coupled between the first integrator stage and the sampling stage. During operation, as the amplitude of the input signal increases, the energy provided through the feed-forward path increases and acts to overcome the gain of the second integrator stage which has the effect of bypassing the second integrator stage and effectively makes the mixed signal processing unit a first order modulator, thereby improving stability of the processor.

In alternative embodiments, a third integrator stage is provided and a second non-linear feedback stage is coupled between the second integrator stage and the sampling stage.

In this embodiment, as the amplitude of the input signal increases, initially the third integrator stage and then the second integrator stage are bypassed in the same manner. Thus the mixed signal processor thus successively becomes a second order modulator and then a first order modulator, thus reducing noise and distortion within the processor. Higher order modulators are also possible using standard sigma-delta design techniques.

In another embodiment of the invention, a method of reducing noise and distortion in a signal processor is disclosed. A first integrator stage is provided configured to receive an input signal and configured to generate a first integrated signal in response thereto. A second integrator stage is provide that is coupled to the first integrator stage and configured to generate a second integrated signal from the first integrated signal. A sampling stage is provided that is configured to sample the second integrated signal from the second integrator stage at a sample frequency and to generated a logic signal. Circuitry within the processor is provided arranged to effectively bypass the second integrator stage when the amplitude of the input signal increases.

In yet another embodiment, a mixed signal processor is disclosed. The mixed signal processor includes a modulation loop. The modulation loop includes a first integrator stage configured to receive an input signal and configured to generate a first integrated signal in response thereto. A second integrator stage integrator stage configured to generate a second integrated signal from the first integrated signal. A sampling stage coupled to the second integrator stage and configured to sample the second integrated signal received from the second integrator stage at a sample frequency and to generated a logic signal. Circuitry configured to substantially overcome the gain of the second integrator stage when the amplitude of the input signal increases thereby substantially reducing noise and distortion generated by the second integration stage from the modulation loop.

BRIEF DESCRIPTION OF THE DRAWINGS

The invention, together with further advantages thereof, may best be understood by reference to the following description taken in conjunction with the accompanying drawings.

DESCRIPTION OF SPECIFIC EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a novel sigma-delta modulator and methods of use thereof.

Reference will now be made in detail to an embodiment of the invention. An example of the embodiment is illustrated in the accompanying drawings. While the invention will be described in conjunction with an embodiment, it will be understood that it is not intended to limit the invention to one preferred embodiment. To the contrary, it is intended to cover alternatives, modifications, and equivalents as may be included within the spirit and scope of the invention as defined by the appended claims.

Broadly speaking, the invention relates to a mixed signal processing unit with non-linear feedforward paths between sigma-delta modulator stages to improve total harmonic distortion (THD) and noise characteristics of the processor and methods thereof. Specifically the mixed signal processing unit includes a first integrator stage configured to receive an input signal and configured to generate a first integrated signal in response thereto, a second integrator stage coupled to the first integrator stage and configured to generate a second integrated signal from the first integrated signal, a sampling stage coupled to the second integrator stage and configured to sample the second integrated signal received from the second integrator stage at a sample frequency and to generated a logic signal, and a non-linear feed-forward signal path coupled between the first integrator stage and the sampling stage. During operation, as the amplitude of the input signal increases, the energy provided through the feed forward path increases and acts to overcome the gain of the second integrator stage. This has the effect of substantially removing the effect of the second integrator stage and simplifies the mixed signal processing unit a first order modulator, thereby reducing noise and distortion within the processor. In alternative embodiments, additional integrators and feed-forward paths can be provided to reduce the noise and THD in larger order delta-sigma processors.

Figure 1:
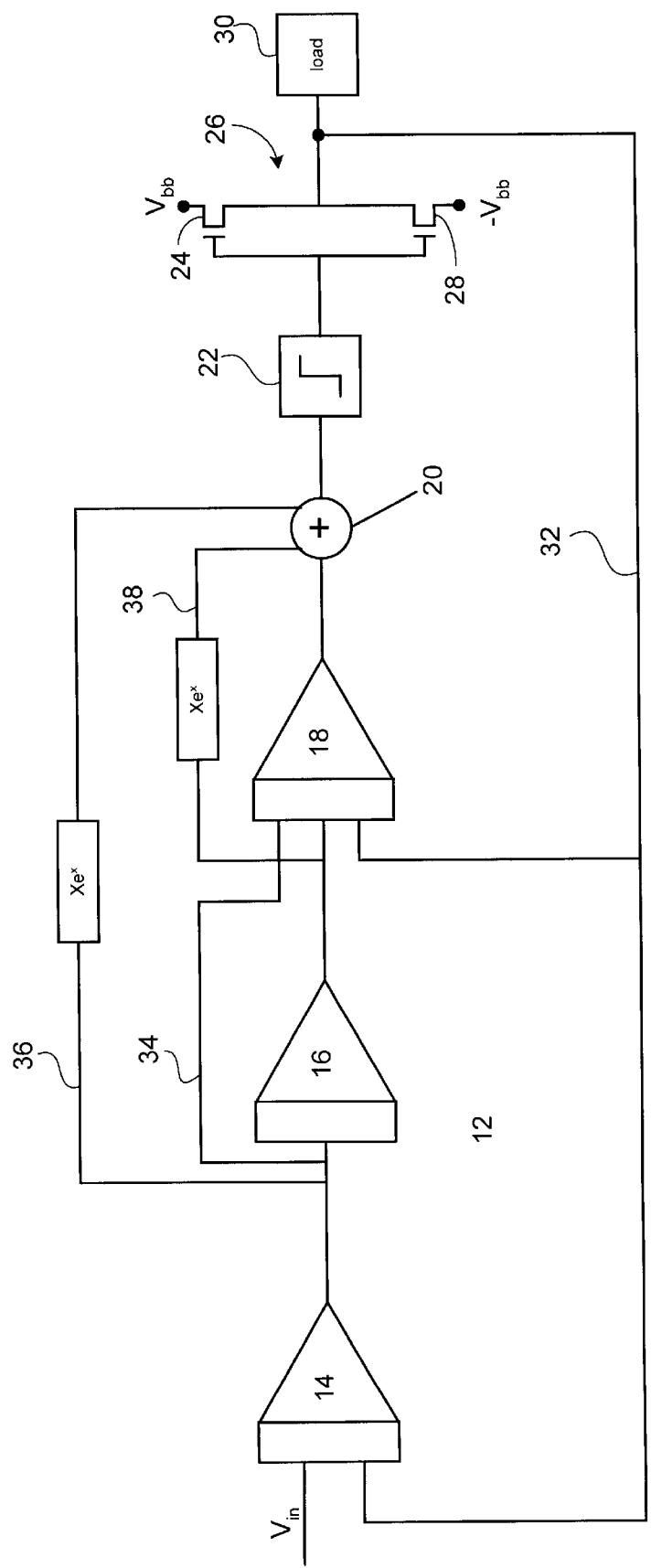
FIG. 1 is a circuit diagram of a mixed signal processing unit according to the present invention.

Referring to FIG. 1, a diagram of a mixed signal processing unit (MSPU) according to the present invention is shown. The MSPU 10 includes a loop 12 which includes a first integrator 14, a second integrator 16, and a third integrator 18, an adder 20, a sampler (i.e., quantizer or comparator) 22 which samples at a frequency rate $f_S$, an output stage 26 including two output transistors 24, 28 coupled to supply voltages $+V_{BB}$ and $-V_{BB}$ and which drive load 30, and a continuous feedback loop 32.

In the described embodiment, the first integrator 14 is configured to receive the input signal $V_{in}$ and a continuous feedback signal from the continuous feedback loop 32. The second integrator 16 is configured to receive the output of the first integrator 16 while the third integrator 18 is configured to receive the output of the second integrator 16, the continuous feedback signal from the continuous feedback loop 32, and the output of the first integrator 14 through a linear feed-forward path 34. The adder 20 is configured to receive three inputs, including the output of third integrator 18, a non-linear feed-forward input 36 from the first integrator 14, and another non-linear feedforward input 38 from the second integrator 16. In various embodiments of the invention, the non-linear feed-forward paths 36 and 38 (i.e., $Xe^x$) can define any concave upward transfer function that maintains signal polarity, such as $X^3$, $X^5$, or $X^7$. Futher, these feed forwards can be scaled and do not need to be identical. It can be beneficial to have the strongest feed forward for later stages.

During operation, an input signal $V_{in}$ and the continuous feedback signal from the feedback path 32 are added' and provided to the input of first integrator 14. The output of first integrator 14 is provided directly to the second integrator 16 and the third integrator 18 through the linear feed-forward path 34. The output of the first integrator 14, the second integrator 16, and the continuous feedback signal from the feedback path 32 are provided to the input of the third integrator 18. The adder 20 adds the output of the third integrator 18 and the signals from non-linear feedforward paths 36 and 38. The sampler 22 samples the signal at the output of the adder 20 at the frequency rate fs and generates a resulting logic signal. The output stage 24, which receives the resulting logic signal, generates the continuous output signal which is used to drive the load 30 and which is provided to the first integrator 14 and the third integrator 18 through the continuous feedback path 32. Since the feed-forward path 34 is linear, the overall transfer function of the MSPU 10 is not effected by this signal path. The nonlinear feed forward paths 36 and 38, however, do effect the transfer function of the MSPU 10, depending on the amplitude of the input signal $V_{in}$, as described below.

When the amplitude of $V_{in}$ is relatively small, the voltage at the inputs to the transfer functions $Xe^x$ of nonlinear feed-forward paths 36 and 38 are relatively small. Consequently the amount of feed-forward energy is small. This feed-forward energy, along with the quantization noise generated by the sampler 22, are noise-shaped out of the modulator loop 12 by the continuous feedback loop 32 and therefore have little consequence within the MSPU 10.

On the other hand, when $V_{in}$ increases, the signals introduced by the integrators 14, 16 and 18 and the noise within the MSPU 10 both increase.

Eventually the output of the MSPU 10 may become unstable if $V_{in}$ becomes too large. To remedy or substantially reduce the possibility of this occurring, the non-linear feed-forward paths 36 and 38 are provided between the adder 20 and the inputs of the second integrator 16 and third integrator 18 respectively. As $V_{in}$ increases, the gain across the feed-forward path 36 and feed-forward path 38 increases and eventually the gain of the third integrator 18 and second integrator 16 are respectively overcome. Accordingly, as $V_{in}$ increases, initially the third integrator 18 and then the second integrator 16 are effectively "removed" from the MSPU 10 and the circuit effectively "simplifies" to a second order and then a first order delta-sigma modulator. The THD and noise generated by the third integrator is 18 and second integrator 16 are therefore effectively removed or substantially reduced from the loop 12 for the larger $V_{in}$.

Figure 2:
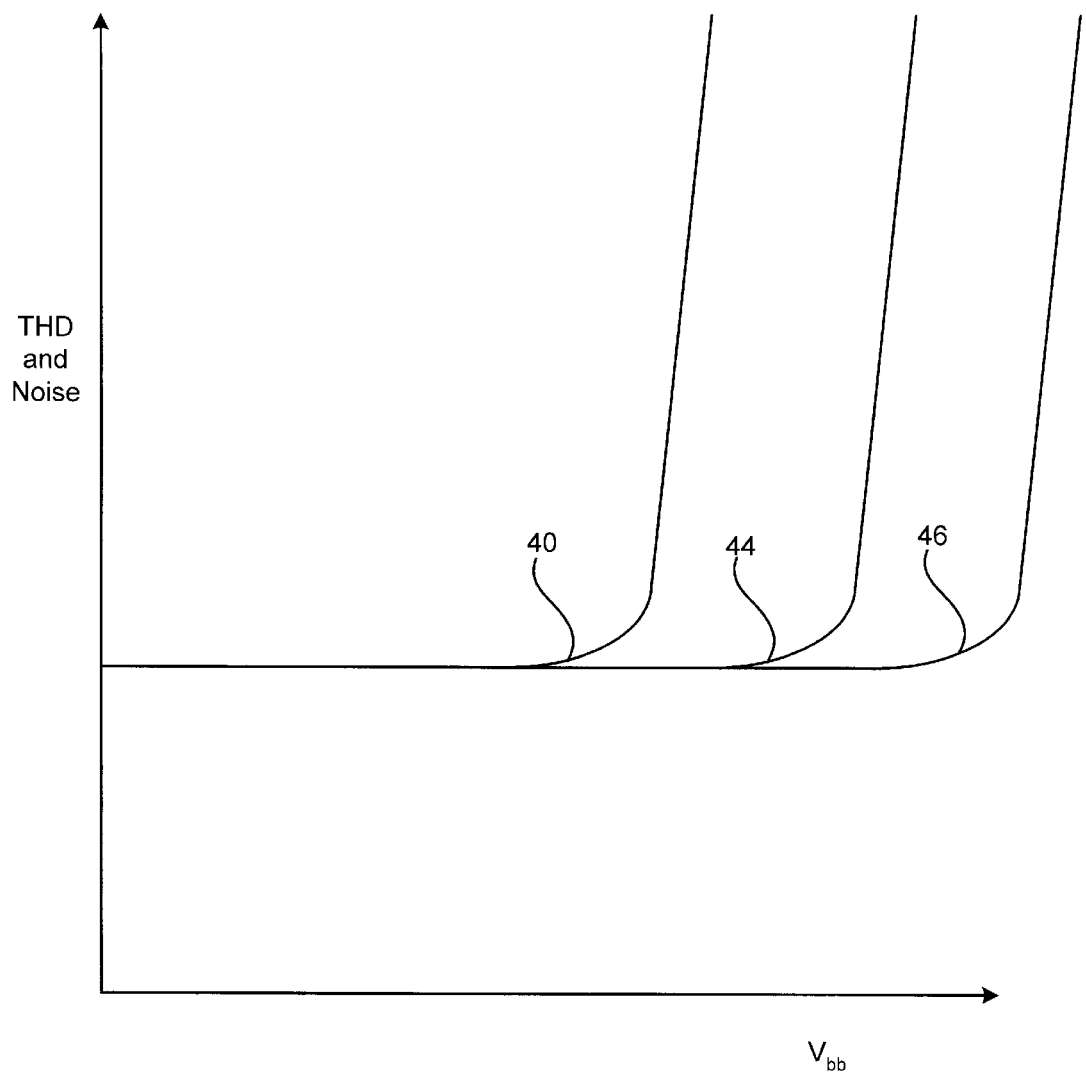
FIG. 2 is a plot of various THD and noise curves versus supply voltage of the mixed signal processing unit according to the present invention.

Referring to FIG. 2, a plot of various THD and noise curves versus supply voltage of a particular implementation the mixed signal processing unit (MSPU) 10 is shown. The plot shows that with relatively low values of $V_{in}$ the MSPU 10 acts like a third-order modulator and the point 40 at which the THD and noise goes unstable (hereafter referred to as the "knee"), occurs at a relatively low value of the output voltage generated at the output stage 24. As $V_{in}$ increases, the third integrator 18 is first effectively removed, and the MSPU 10 is simplified into a second-order modulator. Consequently the point 44 which the knee occurs and the output becomes unstable is increased. In fact, the non-linearities can be selected to completely avoid instability.

With an additional increase in $V_{in}$, the second integrator 16 is also effectively removed, the MSPU 10 simplifies into a first-order modulator, and the point 46 where the knee occurs happens at an even higher output voltage. Optimal stability if achieved when all other integrator steps are bypassed.

Figure 3:
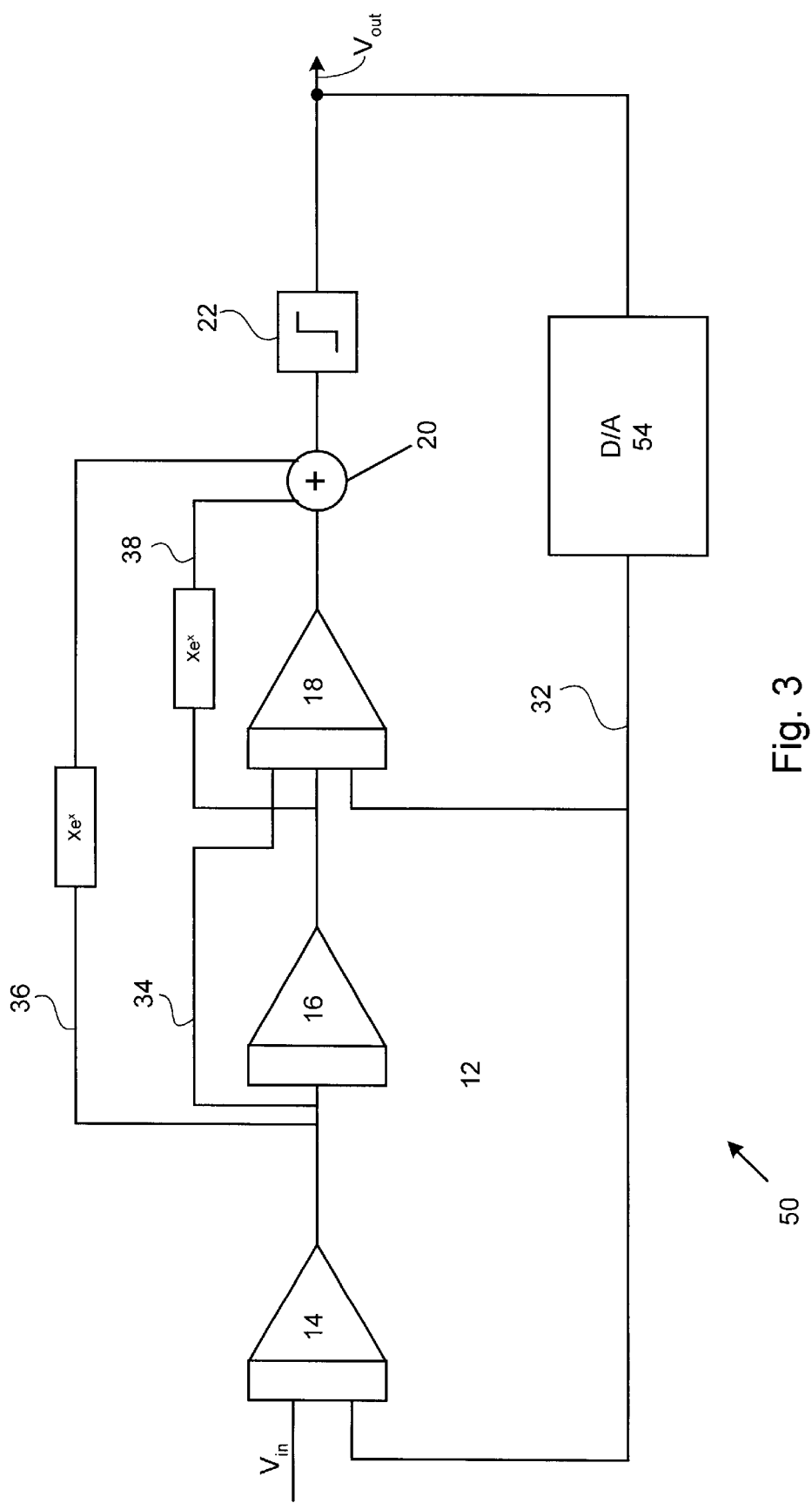
FIG. 3 is a circuit diagram of a delta sigma modulator according to another embodiment of the present invention.

Referring to FIG. 3, a circuit diagram of a delta sigma modulator 50 according to another embodiment of the present invention is shown. This modulator 50 is substantially identical to the MSPU 10 shown in FIG. 1, except a D/A 54 is provided between the output of the comparator 22 and the inputs of integrator 14 and the integrator 18. This shows how this technique can be applied to standard modulators. Since like reference numerals in FIG. 3 perform the same or similar function as described in relation to FIG. 1, a detail description of these elements is not provided herein.

While the present invention has been described in regard to the embodiments described above, it should be understood by those skilled in the art that other alternatives and embodiments of the invention can be used. For example, MSPU 10 can be configured as a fourth order, fifth order or even higher order modulator. Similar to the lower order modulator, non-linear feed forward is applied from each stage to later stages (ususally after the last integration). This and other changes can be made without departing from the scope and spirit of the invention, which is dictated by the following claims.

While this invention has been described in terms of a preferred embodiment, there are alterations, permutations, and equivalents which fall within the scope of this invention. It should also be noted that there are many alternative ways of implementing both the process and apparatus of the present invention. It is therefore intended that the invention be interpreted as including all such alterations, permutations, and equivalents as fall within the true spirit and scope of the present invention.

Therefore, the present examples are to be considered as illustrative and not restrictive, and the invention is not to be limited to the details given herein, but may be modified within the scope of the appended claims along with their full scope of equivalents.

What is claimed is:

1. A signal processor comprising:
   a first integrator stage configured to receive an input signal and configured to generate a first integrated signal in response thereto;
   second integrator stage coupled to the first integrator stage and configured to generate a second integrated signal from the first integrated signal;
   sampling stage configured to sample the second integrated signal from the second integrator stage at a sample frequency and to generated a logic signal; and
   a non-linear feed-forward signal path coupled between the first integrator stage and the sampling stage.

2. The processor of claim 1, wherein the nonlinear feed-forward path defines a concave upward transfer function.

3. The processor of claim 2, wherein the transfer function is defined by one of the following transfer functions: $X^3$, $X^5$, or $X^7$.

4. The processor of claim 1, further comprising an output stage coupled to the sampling stage and configured to generate a substantially continuous output signal in response to the logic-signal.

5. The processor of claim 4, further comprising a feedback loop coupled between the output stage and the first integrator stage and configured to feed-back the continuous output signal to the first integrator stage.

6. The processor of claim 5, further comprising a signal adder configured add the input signal and the continuous feedback signal at an input of the first integrator stage.

7. The processor of claim 1, further comprising a feedback loop including a digital-to-analog converter coupled between the sampling stage and the first integrator stage.

8. The processor of claim 1, further comprising: a third integrator stage coupled between the second integrator stage and the sampling stage; and a second non-linear feed-forward signal path coupled between the second integrator stage and the sampling stage.

9. The processor of claim 8, wherein the second non-linear feed-forward stage defines a concave upward transfer function.

10. The processor of claim 9, wherein the transfer function is defined by one of the following transfer functions: $X^3$, $X^5$, or $X^7$.

11. The processor of claim 8, further comprising a linear feed-forward path between the first integrator stage and the third integrator stage.

12. A method of reducing noise and distortion in a signal processor comprising:
providing a first integrator stage configured to receive an input signal and configured to generate a first integrated signal in response thereto providing a second integrator stage coupled to the first integrator stage and configured to generate a second integrated signal from the first integrated signal; and
providing a sampling stage configured to sample the second integrated signal from the second integrator stage at a sample frequency and to generated a logic signal; providing circuitry within the processor to effectively bypass the second integrator stage when the amplitude of the input signal increases, wherein the circuitry provides a non-linear feed-forward signal path coupled between the first integrator stage and the sampling stage.

13. The method of claim 12, further comprising: providing a third integrator stage coupled between the second integrator stage and the sampling stage; and providing a second non-linear feed-forward signal path coupled between the second integrator stage and the sampling stage to effectively bypass the third integrator stage when the amplitude of the input signal increases.

14. The method of claim 12, further comprising providing a continuous feedback path between an output stage coupled to the sampling stage and the first integrator stage.

15. The method of claim 12, further comprising providing a feedback path including a digital-to-analog converter between the sampling stage and the first integrator stage.

16. A mixed signal processor comprising:
a modulation loop including:
a first integrator stage configured to receive an input signal and configured to generate a first integrated signal in response thereto;
a second integrator stage integrator stage and configured to generate a second integrated signal from the first integrated signal;
a sampling stage coupled to the second integrator stage and configured to sample the second integrated signal received from the second integrator stage at a sample frequency and to generated a logic signal; and
circuitry configured to substantially overcome the gain of the second integrator stage when the amplitude of the input signal increases thereby substantially reducing noise and distortion generated by the second integration stage from the modulation loop, wherein the circuitry is a non-linear feed-forward signal path coupled between the first integrator stage and the sampling stage.

17. The processor of claim 16, wherein the modulation loop further comprises:

a third integrator stage coupled between the second integrator stage and the sampling stage; and
second circuitry configured to substantially overcome the gain of the third integrator stage when the input signal increases thereby substantially removing the noise and distortion generated by the third integration stage from the modulator loop.

18. The processor of claim 17, wherein the second circuitry is a non-linear feed-forward signal path coupled between the second integrator stage and the sampling stage.

19. The processor of claim 16, further comprising a continuous feedback path between an output stage coupled to the sampling stage and the first integrator stage.

20. The processor of claim 16, further comprising a feedback path including a digital-to-analog converter between the sampling stage and the first integrator.

21. In a mixed signal processor that includes a first integrator coupled to a second integrator, a third integrator, an adder, a sampler, an output stage coupled to the first integrator by way of a continuous feedback loop, a method of processing a digital input signal so as to improve total harmonic distortion and noise characteristics, comprising:

(a) providing the digital input signal and a continuous feedback signal at the first integrator;

(b) generating a first integrator output signal based upon the input signal and the continuous feedback signal by the first integrator;

(c) providing the first integrator output signal directly to the second integrator;

(d) generating a second integrator output signal based upon the first integrator output signal;

(e) providing the first integrator output signal by way of a linear feed forward path, the second integrator output signal, and the continuous feedback signal to a third integrator;

(f) generating a third integrator output signal based upon the providing(e);

(g) generating an adder output signal by adding the third integrator output signal, a first non-linear feedforward signal, and a second non-linear feedforward signal by the adder;

(h) generating a logic signal by sampling the adder output signal by the sampler; and (i) generating a continuous output signal by an output stage based upon the logic signal, wherein the continuous feedback signal is based upon the continuous output signal.

22. A method as recited in claim 21, wherein the sampler samples at a frequency rate $f_s$.

23. A method as recited in claim 21, wherein the output stage includes a pullup transitor coupled to a pull down transistor, wherein the logic signal drives the pullup transistor and the pulldown transistor.

24. A method as recited in claim 21, wherein the first and the second non-linear feed-forward path each define a concave upward transfer function.

25. A method as recited in claim 24, wherein the concave upward transfer function is defined by one of the following transfer functions: $X^3$, $X^5$, or $X^7$.

26. A method as recited in claim 21, further comprising a feedback loop that includes a digital-to-analog converter coupled between the sampler and the first integrator.

* * * * *